(12) United States Patent
Grill et al.

(10) Patent No.: US 8,101,150 B2
(45) Date of Patent: Jan. 24, 2012

(54) CONTROL OF CARBON NANOTUBE DIAMETER USING CVD OR PECVD GROWTH

(75) Inventors: Alfred Grill, White Plains, NY (US);
Deborah Neumayer, Danbury, CT (US);
Dinkar Singh, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 246 days.

(21) Appl. No.: 12/483,757

(22) Filed: Jun. 12, 2009

(65) Prior Publication Data

US 2009/0278114 A1 Nov. 12, 2009

Related U.S. Application Data

(62) Division of application No. 10/689,675, filed on Oct. 22, 2003, now Pat. No. 7,628,974.

(51) Int. Cl.
*D01C 5/00* (2006.01)
(52) U.S. Cl. ..................... 423/447.3; 977/843
(58) Field of Classification Search ............... 423/447.3; 977/843
See application file for complete search history.

(56) References Cited

U.S. PATENT DOCUMENTS

| | | | |
|---|---|---|---|
| 6,350,488 B1 * | 2/2002 | Lee et al. | 427/249.1 |
| 2002/0014667 A1 | 2/2002 | Shin et al. | |
| 2005/0079118 A1 * | 4/2005 | Maruyama et al. | 423/447.3 |

FOREIGN PATENT DOCUMENTS

| KR | PUPA 2004-0088902 | 10/2004 |
|---|---|---|
| WO | WO-03068676 | 8/2003 |

OTHER PUBLICATIONS

Sami Rosenblatt, et al., "High Performance Electrolyte Gated Carbon Nanotube Transistors" Nano Letters, vol. 2, No. 8, pp. 869-872, 2002.
Yiming Li, et al., "Growth of Single-Walled Carbon Nanotubes from Discrete Catalytic Nanoparticles of Various Sizes" J. Phys. Chem. vol. 105, pp. 11424-11431, 2001.
Ernesto Joselevich, et al., Vectorical Growth of Metallic and Semiconducting Singe-Wall Carbon Namotubes Nano Letters, vol. 2, No. 10, pp. 1137-1141, 2002.
Shaoming Huang, et al., "Growth of Millimeter-Long and Horizonally Alligned Singe-Walled Carbon Nanotubes on Flat Substrates" American Chemical Society, vol. 125, pp. 5636-5637, 2003.
Alan M. Cassell, et al., "Directed Growth of Free-StandingSingle-Walled Carbon Nanotubes" Journal of American Chemistry, vol. 121, pp. 7975-7976, 1999.

* cited by examiner

*Primary Examiner* — Edward Johnson
(74) *Attorney, Agent, or Firm* — Connolly Bove Lodge & Hutz LLP

(57) ABSTRACT

The diameter of carbon nanotubes grown by chemical vapor deposition is controlled independent of the catalyst size by controlling the residence time of reactive gases in the reactor.

19 Claims, 5 Drawing Sheets

CONTROL OF CARBON NANOTUBE DIAMETER USING CVD OR PECVD GROWTH

CROSS-REFERENCE TO RELATED APPLICATIONS

This application is a divisional application of U.S. patent application Ser. No. 10/689,675 filed, Oct. 22, 2003, and for which priority is claimed under 35 U.S.C. §120, the entire contents of which are hereby incorporated by reference.

TECHNICAL FIELD

The present invention relates to carbon nanotube growth using chemical vapor deposition (CVD) or plasma enhanced chemical vapor deposition (PECVD), and more specifically to the control of the carbon nanotube diameter during the CVD or PECVD growth.

BACKGROUND ART

Carbon nanotube based field effect transistors (CNTFETs) show great promise for device applications. Recently CNTFETs with excellent electrical characteristics comparable to state-of-the-art silicon MOSFETs have been demonstrated [see, for example, Rosenblatt et al., "High Performance Electrolyte-Gates Carbon Nanotube Transistors", *NanoLetters*, 2(8), (2002) pp. 869-72]. The electrical characteristics of CNTFETs however depends largely on the band-gap of the single wall carbon nanotube (SWNT) forming the channel of the transistor. Since the band-gap of SWNTs has a strong dependence on the diameter, accurate control of the diameter is essential to the success of any device technology based on carbon nanotubes.

A widely used technique for the growth of SWNTs with a narrow diameter distribution is based on the laser ablation of a graphite target. However controlled placement and orientation of tubes produced by laser ablation has proved extremely challenging, and limits the usefulness of this technique for circuit applications. A more attractive approach for circuit integration is to grow the carbon nanotubes in place on a suitable substrate using chemical vapor deposition (CVD). Various studies have shown the feasibility of controlling the orientation and origin of CVD grown carbon nanotubes using substrates with patterned catalyst [see, for example, Huang et al., "Growth of Millimeter-Long and Horizontally Aligned Single-Walled Carbon Nanotubes on Flat Substrates", *J. American Chemical Soc.*, 125 (2003) pp. 5636-5637].

A crucial difficulty in obtaining individual SWNTs by CVD is control of nanometric catalyst particle size at growth temperatures of 700-1000° C. It has been theorized that the particle size of the growth catalyst used can define the diameter of as grown carbon nanotubes. This hypothesis has been supported by the observation that catalytic particles at the ends of CVD grown SWNT have sizes commensurate with the nanotube diameters [see, for example, Li et al., "Growth of Single-Walled Carbon Nanotubes from Discrete Catalytic Nanoparticles of Various Sizes", J. Physical Chemistry, 105 (2001), pp. 11424-11431]. Catalysts typically employed are transition metals, notably Fe, Mo, Co, NI, Ti, Cr, Ru, W, Mn, Re, Rh, Pd, V or alloys thereof. However, the synthesis of small catalyst particles with a narrow diameter distribution is complicated and difficult to control.

Numerous strategies have been employed to control catalyst size and thus CNT diameters. One of the difficulties is to prevent catalyst agglomeration during growth of the CNT at elevated temperatures. One strategy has been to embed the catalyst particles in a high surface area silica or aluminosilicate matrix, which does not sinter during heating as detailed by Cassell et al., *J. Am. Chem. Soc.* 1999, 121, 7975-7976. Although a high yield of SWNT is obtained with the catalyst matrix, the matrix is extremely rough and nonconductive making patterning and electrical contact difficult. Other approaches to control the catalyst particle size include the preparation of dilute discrete nano particles in solution utilizing ferrite (iron storage protein) micelles, polymers or other coordinating reagents that bind the surface of the nanoparticles and prevent them from growing bigger, as described by Li et al., supra. However, the synthesis of dilute discrete nano particles in solution suffers from the difficulty of tightly controlling particle size and limiting their agglomeration during CNT growth. Additionally, the dilute nature of the mixtures typically results in a lower SWNT yield, presumably due to the lower density of active sites. Other difficulties include the need to remove excess organic material surrounding the metal nanoparticle by pyrolysis and to reduce the oxide to activate the catalyst.

Another drawback of controlling the carbon nanotube diameter by catalyst particle size is the inability to define sufficiently small catalyst particles by lithography. Sub 1 nanometer dimensions are beyond the realm of even e-beam lithography and preclude the possibility of lithography patterning individual catalyst particles for growth of CNTs with small diameter. Thus growth of thin nanotubes (<5 nanometers) from large catalyst particles (>20 nanometers) which can be patterned lithographically has numerous advantages from an integration standpoint.

One of the main challenges facing carbon nanotube based electronics is the low drive currents of present-day CNTFETs. The low drive current stems from the extremely small diameter of SWNTs effectively resulting in a transistor with a narrow width. Using arrays of SWNTs for the channel region will increase the drive current, making CNTFET based technologies feasible. However, at the present time no controlled ways exist forming arrays of CNTs with a well defined pitch. Thus the ability to grow arrays of SWNTs with lithographically controlled origins (limited by ebeam resolution) and small diameters (<5 nanometers) is crucial to the success of CNT electronics.

SUMMARY OF INVENTION

The present invention provides a method for controlling the diameter of SWNTs using CVD or PECVD growth conditions.

The present invention relates to controlling the diameter, $d_{cnt}$, of CVD or PECVD grown CNTs based on the control of the residence time of the gases in the reactor such as by controlling the pressure, or the gas flow rates, or a combination of both, independent of catalyst particle size. As defined by Grill in "Cold Plasma in Materials Fabrication From Fundamentals to Applications" published by IEEE press, 1994, page 91, the gas residence time is: $t_r = p\, vol_r/Q$ Wherein
p=pressure (atmospheres)
$t_r$=volume of reactor ($ccm^3$)
Q=total mass flow (sccm)

The gas residence time is a measure of the average time of the gas in the reactor. Thus, if the flow is constant and the pressure increases, the residence time increases, and if the pressure is constant and the flow increases the residence time decreases. The present inventors have unexpectedly discovered that by varying the residence they can influence the $d_{cnt}$.

If the residence time is too high, only pyrolytic carbon is deposited and if the residence time is too low, nothing is deposited. The residence time is typically about 1 minute to about 20 minutes and more typically about 1 to about 10 minutes. The residence time is typically determined by controlling the pressure, flow or both the pressure and flow in the reactor. By varying the residence time (e.g. growth pressure and/or flow rates) of the CNT precursor gases in the CVD or PECVD reactor, $d_{cnt}$, can be varied from about 0.2 nanometers to several nanometers.

In particular, the present invention relates to a method for controlling the diameter of carbon nanotubes grown by chemical vapor deposition (CVD) or plasma enhanced (PECVD) in the range of about 0.2 to about 100 nanometers comprising:

introducing a catalyst coated substrate into a CVD or PECVD growth reactor;

increasing the reactor chamber temperature to a desired growth temperature;

flowing reactive gases including a carbon containing precursor over the catalyst; and controlling the residence time of the reactive gases in the reactor for controlling the diameter of the carbon nanotubes.

According to preferred aspects, the present invention relates to a method for controlling the diameter of carbon nanotubes grown by chemical vapor deposition (CVD) or plasma enhanced (PECVD) in the range of about 0.2 to about 100 nanometers comprising:

introducing a catalyst coated substrate into a CVD growth reactor;

increasing the reactor chamber temperature to a desired growth temperature;

flowing reactive gases including a carbon containing precursor over the catalyst;

establishing a controlled pressure or controlled gas flow rate or both in the reactor;

adjusting the gas flow of the carbon containing precursor in the case of a controlled gas flow for controlling the diameter of the carbon nanotubes; or adjusting gas pressure in the reactor in the case of a controlled pressure to control the diameter of the carbon nanotubes; or both adjusting the gas flow of the carbon containing precursor; and adjusting the pressure in the reactor in the case of both a controlled gas flow of the carbon containing precursor and controlled pressure in the reactor; to control the diameter of the carbon nanotubes.

A further aspect of the present invention relates to fabricating a SWNT or array of SWNTs having well defined diameters and origins by the above disclosed processes wherein the SWNTs form the channel of a field effect transistor.

A still further aspect of the present invention is a CVD or PECVD grown carbon nanotube obtained by the above disclosed process.

Another aspect of the present invention relates to a SWNT or array of SWNTs forming the channel of a field effect transistor obtained by the above disclosed process.

Another aspect of the present invention comprises a field-effect transistor having source and drain regions and a channel located between the source and drain regions obtained by a process comprising:

depositing a thin film of catalyst;

lithographically patterning the thin film of catalyst to provide catalyst only in the source or drain region or both;

removing unwanted catalyst from the channel region defined by the lithographic pattern;

growing nanotube with a well controlled diameter ranging from about 0.2 nanometers to about 100 nanometers by controlling the residence time of gases in the reactor used for the growing of the nanotube and wherein the channel region extends from the source region to the drain region.

Other objects and advantages of the present invention will become readily apparent by those skilled in the art from the following detailed description, wherein it is shown and described in the preferred embodiments of the invention, simply by way of illustration of the best mode contemplated of carrying out the invention. As will be realized the invention is capable of other and different embodiments, and its several details are capable of modifications in various obvious respects, without departing form the invention. Accordingly, the description is to be regarded as illustrative in nature and not as restrictive.

BRIEF DESCRIPTION OF THE DRAWINGS

(FIG. 1A shows that higher gas flow results in relatively thin tubes, while FIG. 1B shows that lower gas flows in result in relatively thick tubes).

(FIG. 2A shows a scanning electron micrograph of CNTs grown at 80 torr, while FIG. 2B shows an atomic force microscopy image of CNTs grown at 40 torr using identical catalysts (2 mm thick Fe film) and gas flows.

BEST AND VARIOUS NEEDS FOR CARRYING OUT INVENTION

Figure 1A:
FIGS. 1A-1B show scanning electron microscope images of CNTs grown at atmospheric pressure using identical catalysts, but different gas flows.

The present invention makes it possible to control the diameter of SWNTs using CVD or PECVD growth conditions. The present invention makes it possible to fabricate SWNTs with diameters smaller than the size of the catalyst particles.

The present inventors have discovered that the residence time $t_r$ of the carbon containing precursor in the reactor chamber has a strong influence on $d_{CNT}$. Shorter residence times result in tubes with smaller diameters, and $d_{CNT}$ can be tuned by adjusting $t_r$. Since $t_r$ can be controlled by adjusting the total flow rate, growth pressure or both, this method greatly simplifies catalyst preparation and control of carbon nanotube diameter.

Controlling the carbon nanotube diameter according to the present invention such as by growth pressure and/or flow rate relaxes the constraints on the catalyst particle size. It is a significant advantage to be able to control the diameter using residence time such as by flow rates and growth pressure since it is much easier to control these parameters compared to the catalyst particle size. Thus this invention considerably simplifies catalyst preparation and ease of carbon nanotube integration for circuit applications. Catalyst systems that have been deemed unsuitable for SWNT growth due (a) poor control of the catalyst particle size and (b) large catalyst particle size can now be utilized.

Suitable catalysts include the group of transition metals including Fe, Mo, Co, Ni, Ti, Cr, Ru, Mn, Re, Rh, Pd, V or alloys thereof. Since accurate size control of the catalyst particles is not required, a variety of catalyst systems deposited by a variety of solution deposition, or physical vapor deposition can be utilized for CNT growth. For example, catalysts may be deposited in the form of (a) thin metal films (on the order of 1-2 nanometers thick) which agglomerate at the growth temperature forming nanoparticles of the catalyst which are typically in the range of about 0.5 to about 30 nanometers in size (b) lithographically defined or (c) embedded into a suitable support structure such as porous alumina or silica. Any other suitable technique for achieving the desired level of size control may be employed.

The catalyst is then ramped up to the desired growth temperature in a suitable ambient prior to initiating carbon nanotube growth using a carbon containing precursor. The growth temperature is typically about 400 to about 1200° C. and more typically about 500 to about 1000° C.

Suitable carbon containing precursors include but are not limited to aliphatic hydrocarbons, aromatic hydrocarbons, carbonyls, halogenated hydrocarbons, silyated hydrocarbons, alcohols, ethers, aldehydes, ketones, acids, phenols, esters, amines, alkylnitrile, thioethers, cyanates, nitroalkyl, alkylnitrate, and/or mixtures of one or more of the above, and more typically methane, ethane, propane, butane, ethylene, acetylene, carbon monoxide, benzene and methylsilane. Other reactive gases such as hydrogen and ammonia, which play an important role in CNT growth, may also be introduced. Also, carrier gases such as argon, nitrogen and helium can be introduced.

The residence time of the carbon containing precursor can be controlled by flow rate and/or growth pressure. By adjusting the residence time such as by adjusting gas flow rates and/or the growth pressure, the diameter of the carbon nanotube can be controlled.

The residence time is typically about 1 minute to about 20 minutes and more typically about 1.2 minutes to about 10 minutes. The gas flow rate is typically about 1 sccm to about $10^4$ sccm and more typically about 20 sccm to about 2000 sccm. The growth pressure is typically about 1 mTorr to about 760 Torr, and more typically about 1 Torr to about 760 Torr.

The diameter of the carbon nanotubes is typically about 0.5-100 nanometers, more typically about 0.8 to about 50 nanometers and even more typically about 1 to about 5 nanometers. The size distribution of the diameter is typically about 0.3 to about 5 nanometers and more typically about 0.5 to about 1.5 nanometers.

Films according to the present invention can be deposited through a mask or patterned using conventional lithography techniques allowing the growth of CNTs with small diameters (<5 nanometers) from lithographically defined catalyst islands (>20 nanometers in diameter). Thus using this technique one can easily grow an array of tubes in a controlled manner for FET applications where the nanotubes form the channel. Additionally, this method can be used to further narrow the distribution in $d_{CNT}$ for a catalyst system with a given distribution of catalyst particle size.

The following non-limiting examples are presented to further illustrate the present invention.

EXAMPLE 1

This example demonstrates the effect of flow rate on nanotube diameter.

Figure 1B:
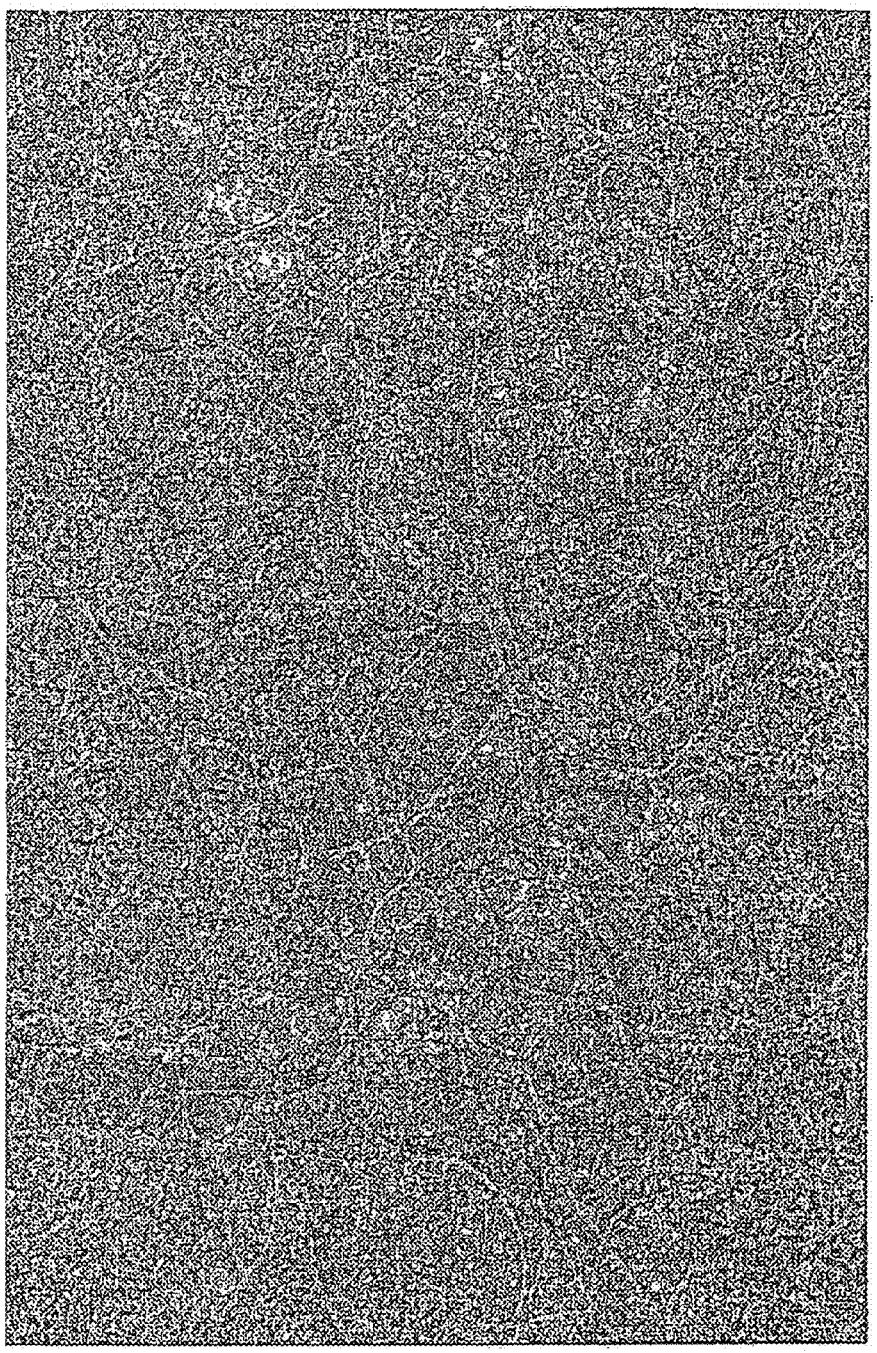

A catalyst comprising an alumina silicate matrix impregnated with Fe/Mo nanoparticles is heated up to 900° C. in a hydrogen gas ambient. At 900° C., methane diluted in argon (Ar) is flowed through the reactor chamber over the catalyst. FIG. 1(a) shows a scanning electron micrograph of carbon nanotubes grown at atmospheric pressure for a methane flow rate of 900 sccm and no argon flow (corresponds to a residence time, $t_r$, of ~6.5 min). These growth conditions resulted in relatively thick carbon nanotubes with diameters on the order of about 30 nanometers. FIG. 1(b) shows a scanning electron micrograph of carbon nanotubes grown for a methane flow rate of 900 sccm and an argon flow rate of 1000 sccm (corresponds to $t_r$~3 min). Increasing the total flow rate resulted in a lower residence time for the methane and thinner tubes with $d_{CNT}$<10 nanometers as determined by scanning electron microscopy. Increasing the co-flow of Ar to 5000 sccm ($t_r$~1 min) resulted in no CNT growth. Decreasing CNT diameter with increasing flow rates illustrates that $d_{CNT}$ can be adjusted by controlling the flow rate.

EXAMPLE 2

Figure 2A:
FIGS. 2A-2B illustrate the effects of growth pressure on CNT diameter.
Figure 2B:
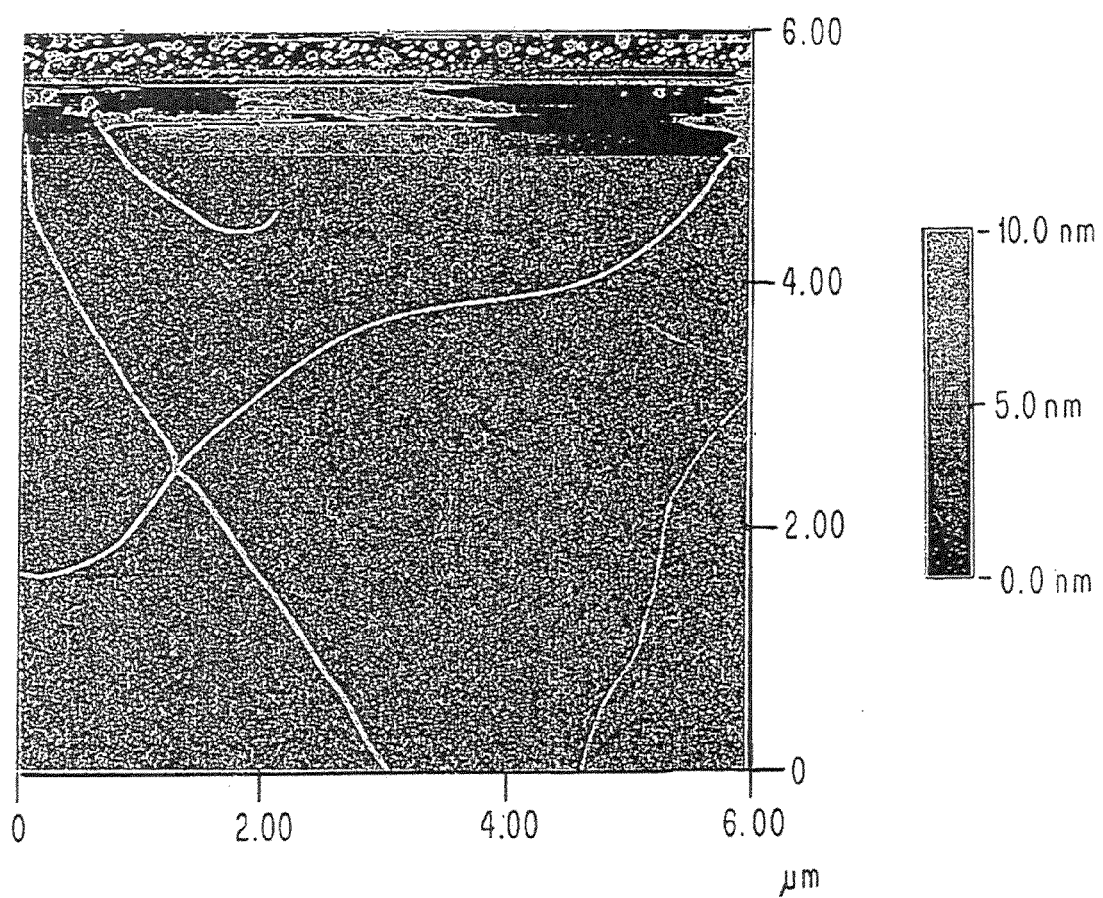

This example demonstrates the effects of growth pressure on CNT diameter. A catalyst comprising a 2 nanometers thick patterned film of Fe is heated up to the growth temperature of 950° C. in a hydrogen gas ambient. FIGS. 2(a)-2(b) illustrate the effects of growth pressure on CNT diameter. FIG. 2(a) shows a scanning electron micrograph of CNTs grown at 80 torr and methane flow of 100 sccm ($t_r$~6 min), while FIG. 2(b) shows an atomic force microscopy image of CNTs grown at 40 torr for the same methane flow rate ($t_r$~3 min). It is evident that the lower growth pressure results in CNTs with a much smaller diameter. While the $d_{CNT}$=2.5±1.5 nanometers for the growth at 40 torr, the CNT diameter is much larger (on the order of 50 nanometers) for a growth pressure of 80 torr.

From the above it is clear that the residence time can be used to control tube diameter from <1 nanometer diameters up-to 50 nanometers or greater. It is also possible to produce tubes having a narrow distribution (<1.5 nanometers) using this technique as shown in FIG. 2(b).

Figure 3:
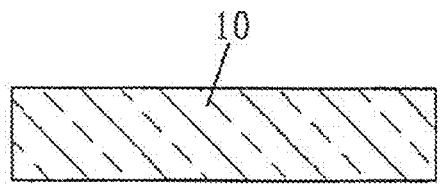
FIG. 3 is a schematic representation of the cross-section of the starting substrate.

The carbon nanotubes according to the present invention can be used in fully integrated structures using a thin metal film. FIG. 3 shows the cross-section of a suitable substrate, 10 which for example can be silicon, silicon oxide, germanium, alloys of silicon and germanium, silicon carbide, III-V semiconductors, silicon nitride, quartz, sapphire, beryllium oxide, and aluminum nitride, other semiconductors, other insulators, conductors, such as metals or nitrides of metals. A thin film (0.5-30 nanometers) of metal catalyst such as a transition group metal including Fe, Mo, Co, Ni, Ti, Cr, Ru, W, Mn, Re, Rh, Pd, V or alloys thereof is then deposited on the substrate using a suitable technique such as chemical vapor deposition, atomic layer deposition, chemical solution deposition, physical vapor deposition, molecular bean epitaxy, metal evaporation, sputtering or electroplating. The catalyst may be prepared inside patterned porous structures.

Figure 4:
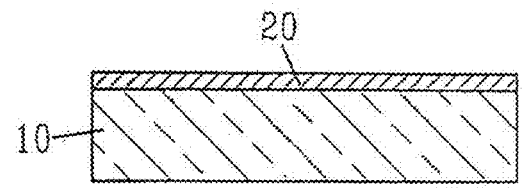
FIG. 4 is a schematic representation of the cross-section of the starting substrate with a thin catalyst film.

FIG. 4 shows a cross-section of the thin metal film 20, deposited on the substrate. The thin metal film is then patterned using any lithographic technique e.g. ebeam, optical dip-pen, micro-imprint etc. The unwanted catalyst can be removed by either a lift-off process or by etching so that the dimensions of the catalyst island are typically about 100 nanometers or less.

Figure 5A:
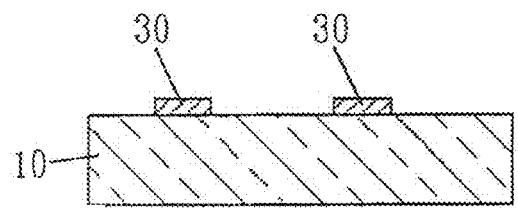
FIGS. 5A-5B show the cross-sectional view (FIG. 5A) and plan view of the substrate with patterned catalyst islands (FIG. 5B).
Figure 5B:
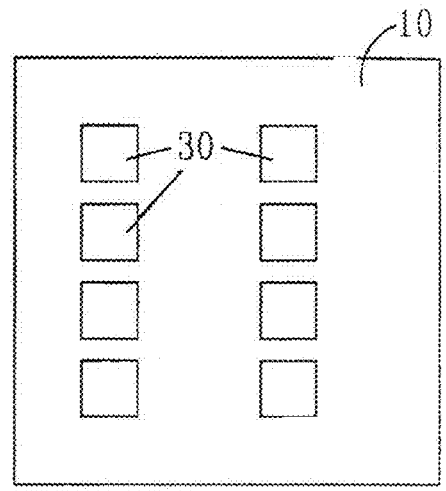

FIGS. 5(a) and (b) show the cross-sectional and plan view of the patterned substrates using the method described above. Each catalyst island acts as the nucleation center for a CNT. The CNTs can be oriented during growth using electric fields or flow direction as has been described in the literature [see, for example, Joselevich, "Vectorial Growth of Metallic and Semiconducting Single-Wall Carbon Nanotubes", *NanoLetters*, 2 (2002) pp. 1137-1141].

Figure 6:
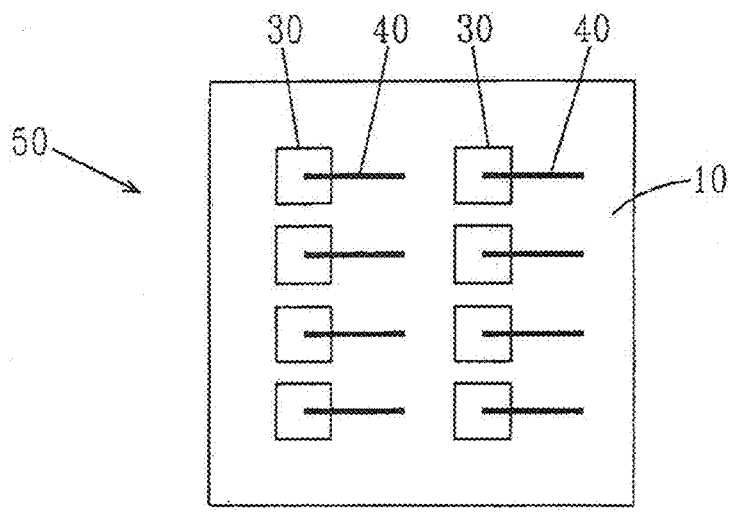
FIG. 6 shows a plan view of the substrate with patterned catalyst islands after growth of carbon nanotubes.

FIG. 6 shows the plan view of the final structure 50 after growth of aligned CNTs, 40. The structure, thus formed comprises an array of CNTs with lithographically defined origins and well controlled diameters. The array of CNTs thus formed can be used as the channel of a CNT based FET for high drive current.

The present disclosure describes and illustrates a method for controlling the diameter of carbon nanotubes by controlling the residence time in a CVD reactor such as through gas flow and/or pressure, independent of catalyst particle size. This process offers a significant advantage in terms of catalyst preparation and the growth. When used in conjunction with a catalyst system with a narrow catalyst particle size, carbon nanotubes with a very narrow diameter distribution can be obtained. Also described above is a method for forming a novel structure comprising an array of CNTs with well defined diameters and lithographically defined origins. This structure is suitable for forming the channel region of CNT based FETs.

While the present invention has been described in an illustrative manner, it should be understood that the terminology used is intended to be in a nature of words of description rather than of limitation. Furthermore, while the present invention has been described in terms of several preferred embodiments, it is to be appreciated that those skilled in the art will readily apply these teachings to other possible variations of the inventions. Also, it is intended that the appended claims be construed to include alternative embodiments.

All publications and patent applications cited in this specification are herein incorporated by reference as if each individual publication or patent application were specifically and individually indicated to be incorporated by reference.

What is claimed is:

1. A carbon nanotube or array of carbon nanotubes having a controlled diameter ranging from about 0.2 nanometers to about 100 nanometers and having a diameter size distribution of about 0.3 to about 5 nanometers obtained by the process for controlling the diameter of carbon nanotubes grown by chemical vapor deposition (CVD) or by plasma enhanced chemical vapor deposition (PECVD) in the range of about 0.2 to about 100 nanometers comprising:
    introducing a catalyst substrate into a CVD OR PECVD growth reactor;
    increasing the reactor chamber temperature to a desired growth temperature;
    flowing reactive gases including a carbon containing precursor; and
    controlling the residence time of the carbon containing precursor in the reactor to control the diameter of the carbon nanotubes.

2. A structure comprising a single CNT or an array of CNTs has lithographically defined origins formed by the process of:
depositing a thin film of catalyst;
    lithographically patterning the thin film of catalyst;
    removing unwanted catalyst defined by the lithographic pattern;
    growing nanotube with a well controlled diameter ranging from about 0.2 nanometers to about 100 nanometers and a diameter size distribution of about 0.3 nanometers to about 5 nanometers by controlling the residence time of gases in the reactor used for the growing of the nanotube.

3. The structure of claim 2 wherein the catalyst comprises at least one member selected from the group consisting of Fe, Mo, Co, Ni, Ti, Cr, Ru, W, Mn, Re, Rh, Pd, V or alloys thereof.

4. An FET comprising source and drain regions and a channel located between the source and drain regions obtained by a process comprising:
    depositing a thin film of catalyst;
        lithographically patterning the thin film of catalyst to provide catalyst only in the source or drain region or both;
    removing unwanted catalyst from the channel region defined by the lithographic pattern;
    growing nanotube with a well controlled diameter ranging from about 0.2 nanometers to about 100 nanometers and a diameter size distribution of about 0.3 nanometers to about 5 nanometers by controlling the residence time of gases in the reactor used for the growing of the nanotube and wherein the channel region extends from the source region to the drain region.

5. An integrated circuit containing one or more FETs of claim 4.

6. The carbon nanotube or array of carbon nanotubes of claim 1 wherein the controlled diameter is from about 0.8 nanometers to about 50 nanometers and the diameter size distribution is about 0.5 to about 1.5 nanometers.

7. The carbon nanotube or array of carbon nanotubes of claim 1 wherein the controlled diameter is from about 1 nanometer to about 5 nanometers and the diameter size distribution is about 0.5 to about 1.5 nanometers.

8. The structure of claim 2 wherein the controlled diameter is from about 0.8 nanometers to about 50 nanometers and the diameter size distribution is about 0.5 to about 1.5 nanometers.

9. The structure of claim 2 wherein the controlled diameter is from about 1 nanometer to about 50 nanometer and the diameter size distribution is about 0.5 to about 1.5 nanometers.

10. The FET of claim 4 wherein the controlled diameter is from about 0.8 nanometers to about 50 nanometers and the diameter size distribution is about 0.5 to about 1.5 nanometers.

11. The FET of claim 4 wherein the controlled diameter is from about 1 nanometer to about 5 nanometers and the diameter size distribution is about 0.5 to about 1.5 nanometers.

12. The carbon nanotube or array of carbon nanotubes of claim 1 wherein the catalyst comprises at least one member selected from the group consisting of Fe, Mo, Co, Ni, Ti, Cr, Ru, Mn, Re, Rh, Pd, V or alloys thereof.

13. The carbon nanotube or array of carbon nanotubes of claim 1 wherein the catalyst particles have a size about 0.2 nanometers to about 100 nanometers.

14. The carbon nanotube or array of carbon nanotubes of claim 1 wherein the carbon containing precursor comprises at least one member selected from the group consisting of aliphatic hydrocarbons, aromatic hydrocarbons, carbonyls, halogenated hydrocarbons, silyated hydrocarbons, alcohols, ethers, aldehydes, ketones, acids, phenols, esters, amines, alkylnitrile, thioethers, cyanates, nitroalkyl, alkylnitrate, and mixtures thereof.

15. The carbon nanotube or array of carbon nanotubes of claim 1 wherein the carbon containing precursor comprises at least one member selected from the group consisting of methane, ethane, propane, butane, ethylene, acetylene, carbon monoxide and benzene.

16. The carbon nanotube or array of carbon nanotubes of claim 1 which comprises employing a carrier gas along with the carbon precursor.

17. The carbon nanotube or array of carbon nanotubes of claim 16 wherein the carrier gas comprises at least one member selected from the group consisting of argon, nitrogen, helium, hydrogen and ammonium.

18. The carbon nanotube or array of carbon nanotubes of claim 1 wherein the flow rate or pressure or both is adjusted such that the residence time in the reactor can be varied from about 1 minute to about 20 minutes, to tune the CNT diameter.

19. The carbon nanotube or array of carbon nanotubes of claim 1 wherein the diameter of the carbon nanotubes is smaller than the particle size of the catalyst.

* * * * *